(12) United States Patent
Philipp et al.

(10) Patent No.: US 7,619,936 B2
(45) Date of Patent: Nov. 17, 2009

(54) SYSTEM THAT PREVENTS REDUCTION IN DATA RETENTION

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 425 days.

(21) Appl. No.: 11/600,354

(22) Filed: Nov. 16, 2006

(65) Prior Publication Data

US 2008/0117697 A1    May 22, 2008

(51) Int. Cl.
G11C 7/00 (2006.01)

(52) U.S. Cl. .................. 365/201; 365/148; 365/211; 365/225.5; 365/46

(58) Field of Classification Search .......... 365/201, 365/148, 211, 225.5, 46
See application file for complete search history.

(56) References Cited

U.S. PATENT DOCUMENTS

| | | | | |
|---|---|---|---|---|
| 5,898,629 | A * | 4/1999 | Beffa et al. ............... | 365/201 |
| 6,239,415 | B1 | 5/2001 | Paulik et al. | |
| 6,599,762 | B1 * | 7/2003 | Eppes ........................ | 438/14 |
| 6,830,938 | B1 * | 12/2004 | Rodriguez et al. ........... | 438/3 |
| 7,349,246 | B2 * | 3/2008 | Cho et al. ................... | 365/163 |
| 7,436,695 | B2 * | 10/2008 | Nirschl et al. .............. | 365/148 |
| 2007/0139034 | A1 * | 6/2007 | Takada et al. ........... | 324/158.1 |
| 2008/0224305 | A1 * | 9/2008 | Shah ......................... | 257/723 |

OTHER PUBLICATIONS

Stefan Lai, et al., "OUM-A 180 NM Nonvolatile Memory Cell Element Technology for Stand Alone and Embedded Applications". Intel Corporation, 2001. (4 pgs.).

Y.H. Ha, et al., "An Edge Contact Type Cell for Phase Change RAM Featuring Very Low Power Consumption". Samsung Electronics, Co., Ltd., 2003. (2 pgs.).

H. Horii, et al., "A Novel Cell Technology Using N-doped GeSbTe Films for Phase Change RAM". Samsung Electronics Co., Ltd., 2003. (2 pgs.).

* cited by examiner

*Primary Examiner*—Connie C Yoha
(74) *Attorney, Agent, or Firm*—Dicke, Billig & Czaja, P.L.L.C.

(57) ABSTRACT

One embodiment of the present invention provides a system including a tester and a back end manufacturing system. The tester tests a resistive memory and obtains configuration data for the resistive memory. The back end manufacturing system prevents temperatures in back end processing from reducing data retention time of the configuration data in the resistive memory.

36 Claims, 12 Drawing Sheets

SYSTEM THAT PREVENTS REDUCTION IN DATA RETENTION

BACKGROUND

One type of non-volatile memory is resistive memory. Resistive memory utilizes the resistance value of a memory element to store one or more bits of data. For example, a memory element programmed to have a high resistance value may represent a logic "1" and a memory element programmed to have a low resistance value may represent a logic "0". Typically, the resistance value of the memory element is switched electrically by applying a voltage pulse or a current pulse.

One type of resistive memory is phase change memory. Phase change memory uses a phase change material in the resistive memory element. The phase change material exhibits at least two different states, including states referred to as the amorphous state and the crystalline state. The amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store data. In the following description, the amorphous state refers to the state having the higher resistivity and the crystalline state refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including an array of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material of a memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence cell resistance is controlled via a suitable write strategy.

The data retention performance of a phase change memory depends strongly upon the temperature history of the memory. Typically, for nonvolatile memory, data retention is guaranteed for more than ten years at operating temperatures up to 85° C. In a phase change memory, data retention is mainly a property of the phase change material and depends on the crystallization temperature of the phase change material. For $Ge_2Sb_2Te_5$, the data retention performance is about ten years at operating temperatures up to 110° C. Phase change material may begin to crystallize more quickly at temperatures greater than 150° C.

A memory device is not usually operated at a constant ambient temperature, but rather experiences significant changes in the ambient temperature. For example, a memory device for an engine controller of a car experiences extremes in temperatures based on whether the engine is running. In this situation, the data retention of a phase change memory device is impacted by the accumulated temperature budget for the memory device. In addition, data retention is more critical in multi-bit phase change memory cells than in single bit phase change memory cells.

Typically, phase change memory manufacturing includes testing and packaging and soldering, referred to as back end processing. In testing, the phase change memory die are tested and chip configuration data, such as redundancy activation data and bad block management data, is obtained via a tester. The configuration data can be stored in the phase change memory at test. Back end processing includes temperature processing of the phase change memory during packaging and soldering of the phase change memory. Typically, temperatures are 175° C. or greater during temperature processing, which may immediately affect data retention or impact the temperature budget of the phase change memory. Configuration data obtained during testing needs to be retained in the phase change memory over the life of the phase change memory device for normal operations.

For these and other reasons, there is a need for the present invention.

SUMMARY

The present invention provides a system that prevents temperatures in back end processing from reducing data retention time. One embodiment of the present invention provides a system including a tester and a back end manufacturing system. The tester tests a resistive memory and obtains configuration data for the resistive memory. The back end manufacturing system prevents temperatures in back end processing from reducing data retention time of the configuration data in the resistive memory.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
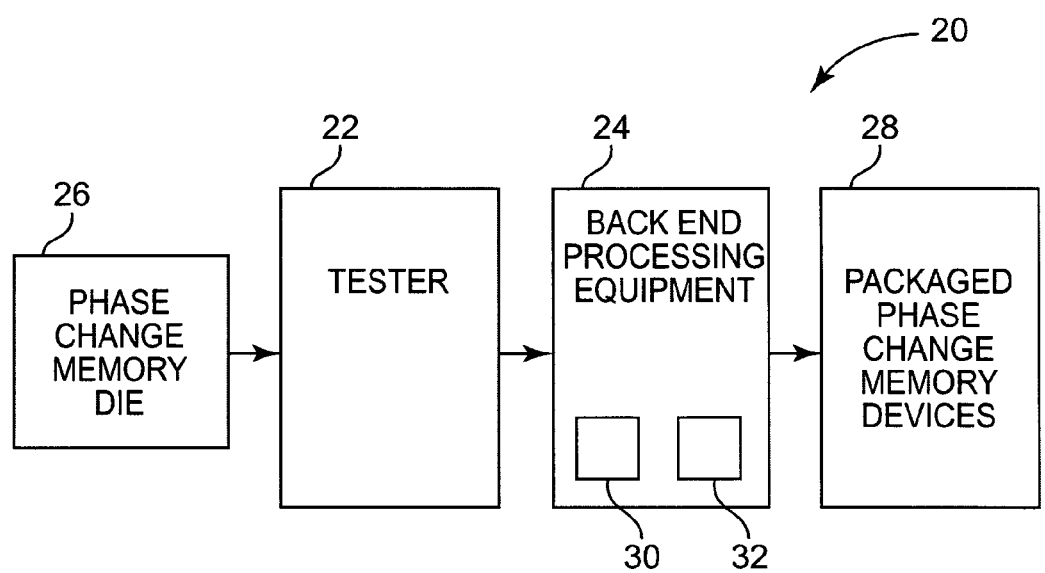
FIG. 1 is a block diagram illustrating one embodiment of a phase change memory manufacturing system according to the present invention.

FIG. 1 is a block diagram illustrating one embodiment of a phase change memory manufacturing system 20 according to the present invention. System 20 includes a tester 22 and back end processing equipment 24. Tester 22 tests each of the phase change memory die 26 and obtains corresponding configuration data, such as redundancy activation data and bad block management data, for each of the phase change memory die 26. In one embodiment, tester 22 is a wafer tester configured to test individual phase change memory die in wafer form. In other embodiments, tester 22 can be any suitable type of tester.

Back end processing equipment 24 processes tested phase change memory die 26 to produce packaged phase change memory devices 28. During back end processing, each of the phase change memory die 26 is exposed to temperature processing during packaging and soldering of the phase change memory die 26. The corresponding configuration data is written into each of the phase change memory die 26 via tester 22 or back end processing equipment 24 and used by the phase change memory die 26 over the life of the phase change memory die 26. System 20 reduces the impact of the temperature processing on data retention and/or enhances data retention to attain full data retention of the configuration data in phase change memory devices 28.

Each of the phase change memory die 26 includes phase change memory elements that store data and each of the phase change memory elements includes phase change material that can be written to at least two different states, including the amorphous state and the crystalline state. Phase changes in the phase change material can be induced reversibly in response to temperature changes. However, processing temperatures that are about equal to the crystallization temperature of the phase change material may cause crystalline nuclei to form in amorphous material, which reduces data retention. Also, processing temperatures that exceed the crystallization temperature of the phase change material may result in data loss.

In one embodiment, each of the phase change memory elements stores one bit of data using the amorphous state and the crystalline state. In one embodiment, each of the phase change memory elements stores more than one bit of data using the amorphous state, the crystalline state, and one or more intermediate resistance states. In one embodiment, each of the phase change memory elements stores two bits of data using the amorphous state, the crystalline state, and two intermediate resistance states. In other embodiments, each of the phase change memory die 26 includes any suitable type of phase change memory elements that store any suitable number of data bits in any suitable states.

In one embodiment of system 20, tester 22 writes the corresponding configuration data into each of the phase change memory die 26 prior to back end processing. During back end processing, the phase change memory die 26 are cooled to a low temperature, such as less than 0° C. or down to minus 20° C., or lower. Also, back end processing equipment 24 includes a cooled chip holder that is used to hold each of the phase change memory die 26 during soldering and/or packaging. The low starting temperature and heat capacity of the phase change memory die 26 keeps the temperature of the phase change memory elements below the crystallization temperature of the phase change memory elements. The effect is enhanced via the cooled chip holder.

In one embodiment of system 20, tester 22 writes the corresponding configuration data into each of the phase change memory die 26 prior to back end processing. During back end processing, the phase change memory die 26 are exposed to temperatures that are close to the crystallization temperature of the phase change memory elements, which reduces data retention. To enhance data retention and achieve full data retention, the configuration data is read from the phase change memory die 26 after temperature processing and written back into the corresponding phase change memory die 26.

In one embodiment of system 20, tester 22 writes the corresponding configuration data into each of the phase change memory die 26 prior to back end processing, which includes packaging and soldering. During back end processing, the phase change memory die 26 are exposed to temperatures that are close to the crystallization temperature of the phase change memory elements, which reduces data retention. To enhance data retention and achieve full data retention, the configuration data is read from the phase change memory die 26 after packaging and written back into the corresponding phase change memory die 26 prior to soldering. Next, the configuration data is read from the phase change memory die 26 after soldering and then written back into the corresponding phase change memory die 26.

In one embodiment of system 20, tester 22 writes corresponding configuration data into each of the phase change memory die 26 prior to back end processing. During back end processing, the configuration data is read from each of the phase change memory die 26 prior to temperature processing. The phase change memory die 26 are exposed to temperatures that are close to or exceed the crystallization temperature of the phase change memory elements, which reduces the data retention time or results in data loss. To enhance data retention and achieve full data retention, the configuration data is written back into the corresponding phase change memory die 26 after temperature processing.

In one embodiment of system 20, tester 22 writes corresponding configuration data into each of the phase change memory die 26 prior to back end processing, which includes packaging and soldering. The phase change memory die 26 are exposed to temperatures that are close to or exceed the crystallization temperature of the phase change memory elements, which reduces the data retention time or results in data loss. To enhance data retention and achieve full data retention, the configuration data is read from each of the phase change memory die 26 prior to packaging. The configuration data is written back into the corresponding phase change memory die 26 after packaging. Next, the configuration data is read from each of the phase change memory die 26 prior to soldering and written back into the corresponding phase change memory die 26 after soldering.

In one embodiment of system 20, tester 22 writes the configuration data into a database. During back end processing, the phase change memory die 26 are exposed to temperatures that are close to or exceed the crystallization temperature of the phase change memory elements, which reduces the data retention time or results in data loss. The configuration data is read from the database and written into the corresponding phase change memory die 26 after temperature processing via back end processing equipment 24.

In one embodiment of system 20, tester 22 writes the configuration data into a database. During back end processing, the phase change memory die 26 are exposed to temperatures that are close to or exceed the crystallization temperature of the phase change memory elements, which reduces the data retention time or results in data loss. The configuration data is read from the database and written into the corresponding phase change memory die 26 after packaging via back end processing equipment 24. Also, the configuration data is read from the database and written into the corresponding phase change memory die 26 after soldering via back end processing equipment 24.

Back end processing equipment 24 includes packaging equipment 30 and soldering equipment 32. Packaging equipment 30 packages the phase change memory die 26, which includes adhesive and mold curing. Soldering equipment 32 solders the phase change memory die 26 to make electrical contact with package pins and includes solder ball reflow and chip soldering. Temperature processing during packaging includes increased temperatures for adhesive and mold curing and temperature processing during soldering includes increased temperatures during solder ball reflow and chip soldering. In one embodiment, the thermal budget during back end processing for adhesive and mold curing is greater than one and half hours at 175° C. In one embodiment, the thermal budget during back end processing for solder ball reflow and chip soldering is less than 20 minutes at 180° C. In any embodiment, temperatures during back end temperature processing may be high enough to reduce data retention or result in data loss in the phase change memory die 26.

During operation, phase change memory die 26 are forwarded to tester 22 and tested. During testing, chip configuration data is obtained for each of the phase change memory die 26. The tested phase change memory die 26 is forwarded to back end processing equipment 24, where the phase change memory die 26 are packaged via packaging equipment 30 and soldered via soldering equipment 32. The configuration data is retained in or written into the phase change memory die 26 via system 20. Each of the resulting packaged phase change memory devices 28 includes its corresponding configuration data and has enhanced data retention and/or full data retention.

Figure 2:
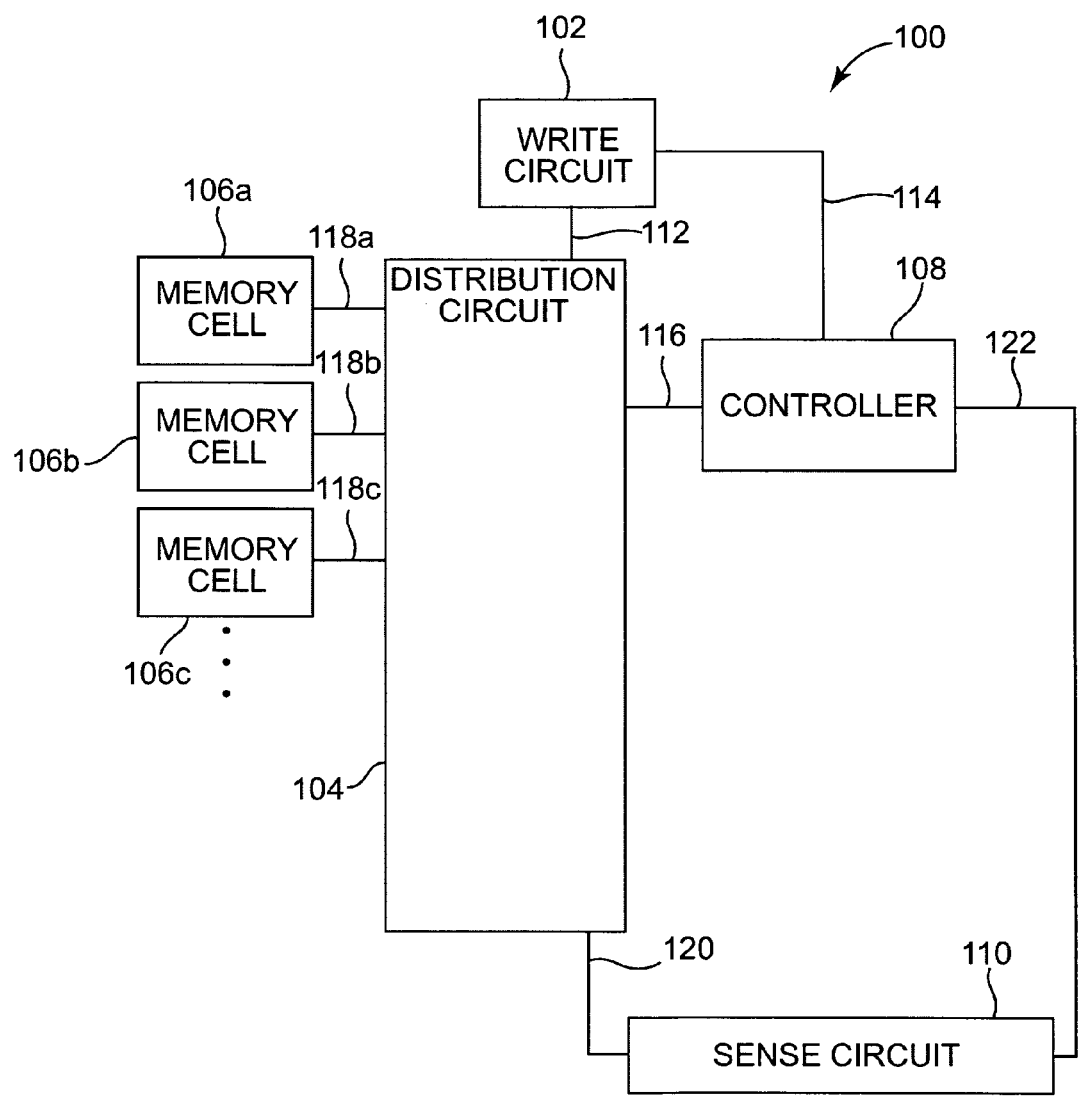
FIG. 2 is a block diagram illustrating one embodiment of a memory device.

FIG. 2 is a block diagram illustrating one embodiment of a memory device 100 that is similar to one of the phase change memory die 26. Memory device 100 includes a write circuit 102, a distribution circuit 104, memory cells 106a, 106b, and 106c, a controller 108, and a sense circuit 110. In one embodiment, memory cells 106a-106c are multi-bit memory cells, also referred to as multilevel memory cells. In a multilevel memory cell, an intermediate resistance value is achieved via coexisting amorphous and crystalline material in the cell. In other embodiments, memory cells 106a-106c can be any suitable type of resistive memory cells.

The temperature budget (TB) relevant for data retention in a phase change memory is defined as follows:

$$TB = \int \alpha(T) T(t) dt \qquad \text{Equation I}$$

Where:
 $\alpha(T)$=sensitivity factor;
 T=temperature; and
 t=time.

The sensitivity factor $\alpha(T)$ is different for each of the two or more states of memory cells 106a-106c and the sensitivity factor $\alpha(T)$ scales to approximately the inverse of the retention time ($t_{ret}^{-1}$). In addition, data retention in memory cells 106a-106c depends not only on the exposed temperature budget but also the cycling age of the memory cells 106a-106c. Once the temperature budget (TB) of memory device 100 exceeds a maximum threshold value, the data stored in memory cells 106a-106c is jeopardized.

As used herein, the term "electrically coupled" is not meant to mean that the elements must be directly coupled together and intervening elements may be provided between the "electrically coupled" elements.

Write circuit 102 is electrically coupled to distribution circuit 104 via signal path 112 and to controller 108 via signal path 114. Controller 108 is electrically coupled to distribution circuit 104 via signal path 116 and distribution circuit 104 is electrically coupled to sense circuit 110 via signal path 120. Sense circuit 110 is electrically coupled to controller 108 via signal path 122.

Distribution circuit 104 is electrically coupled to each of the memory cells 106a-106c via signal paths 118a-118c. Distribution circuit 104 is electrically coupled to memory cell 106a via signal path 118a. Distribution circuit 104 is electrically coupled to memory cell 106b via signal path 118b and distribution circuit 104 is electrically coupled to memory cell 106c via signal path 118c. In one embodiment, memory cells 106a-106c are memory cells in an array of memory cells, where the array of memory cells includes any suitable number of memory cells.

Each of the memory cells 106a-106c includes a phase change material that may be changed from an amorphous state to a crystalline state or from a crystalline state to an amorphous state under the influence of temperature change.

The phase change material of memory cells 106a-106c may be made up of a variety of materials in accordance with the present invention. Generally, chalcogenide alloys that contain one or more elements from group VI of the periodic table are useful as such materials. In one embodiment, the phase change material is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Controller 108 controls the operation of write circuit 102 and sense circuit 110. Controller 108 includes a microprocessor, microcontroller, or other suitable logic circuitry for controlling the operation of write circuit 102 and sense circuit 110. Controller 108 controls write circuit 102 for programming the resistance states of memory cells 106a-106c. Controller 108 controls sense circuit 110 for reading the resistance states of memory cells 106a-106c.

Write circuit 102 provides pulses to memory cells 106a-106c and programs the resistance levels or states into the phase change material of each of the memory cells 106a-106c. In one embodiment, write circuit 102 provides voltage pulses to distribution circuit 104 through signal path 112 and distribution circuit 104 controllably directs the voltage pulses to memory cells 106a-106c through signal paths 118a-118c. In one embodiment, distribution circuit 104 includes a plurality of transistors that controllably direct voltage pulses to each of the memory cells 106a-106c. In other embodiments, write circuit 102 provides current pulses to distribution circuit 104 through signal path 112 and distribution circuit 104 controllably directs the current pulses to memory cells 106a-106c through signal paths 118a-118c.

To program a phase change memory cell of one of the memory cells 106a-106c, write circuit 102 generates a current or voltage pulse for heating the phase-change material in the target phase change memory cell. In one embodiment, write circuit 102 generates an appropriate current or voltage pulse, which is fed into distribution circuit 104 and distributed to the appropriate target cell. The current or voltage pulse amplitude and duration are controlled by controller 108 depending on the specific state to which the target cell is being programmed. Generally, a "set" operation of a memory cell is heating the phase-change material of the target cell above its crystallization temperature (but below its melting temperature) long enough to achieve the crystalline state or a partially crystalline and partially amorphous state. Generally, a "reset" operation of a memory cell is heating the phase-change material of the target cell above its melting temperature, and then quickly quench cooling the material, thereby achieving the amorphous state or a partially amorphous and partially crystalline state. A memory cell can be programmed to a resistance state between an amorphous state and a crystalline state by applying a partial "set" or a partial "reset" pulse to the memory cell to provide amorphous and crystalline fractions of the phase change material.

Sense circuit 110 senses the resistance of phase change material and provides signals that indicate the resistive state of the phase change material in memory cells 106a-106c. Sense circuit 110 reads the states of memory cells 106a-106c via signal path 120. Distribution circuit 104 controllably directs read signals between sense circuit 110 and memory cells 106a-106c via signal paths 118a-118c. In one embodiment, distribution circuit 104 includes a plurality of transistors that controllably direct read signals between sense circuit 110 and memory cells 106a-106c.

Sense circuit 110 can read each of the two or more states of the phase change material in each of the memory cells 106a-106c. In one embodiment, to read the resistance of the phase change material, sense circuit 110 provides current that flows through the phase change material of a selected cell and sense circuit 110 reads the voltage across the selected cell. In one embodiment, sense circuit 110 provides voltage across the phase change material of a selected cell and sense circuit 110 reads the current that flows through the selected cell. In one embodiment, write circuit 102 provides voltage across the selected cell and sense circuit 110 reads the current that flows through the selected cell. In one embodiment, write circuit 102 provides current through the selected cell and sense circuit 110 reads the voltage across the selected cell.

Figure 3:
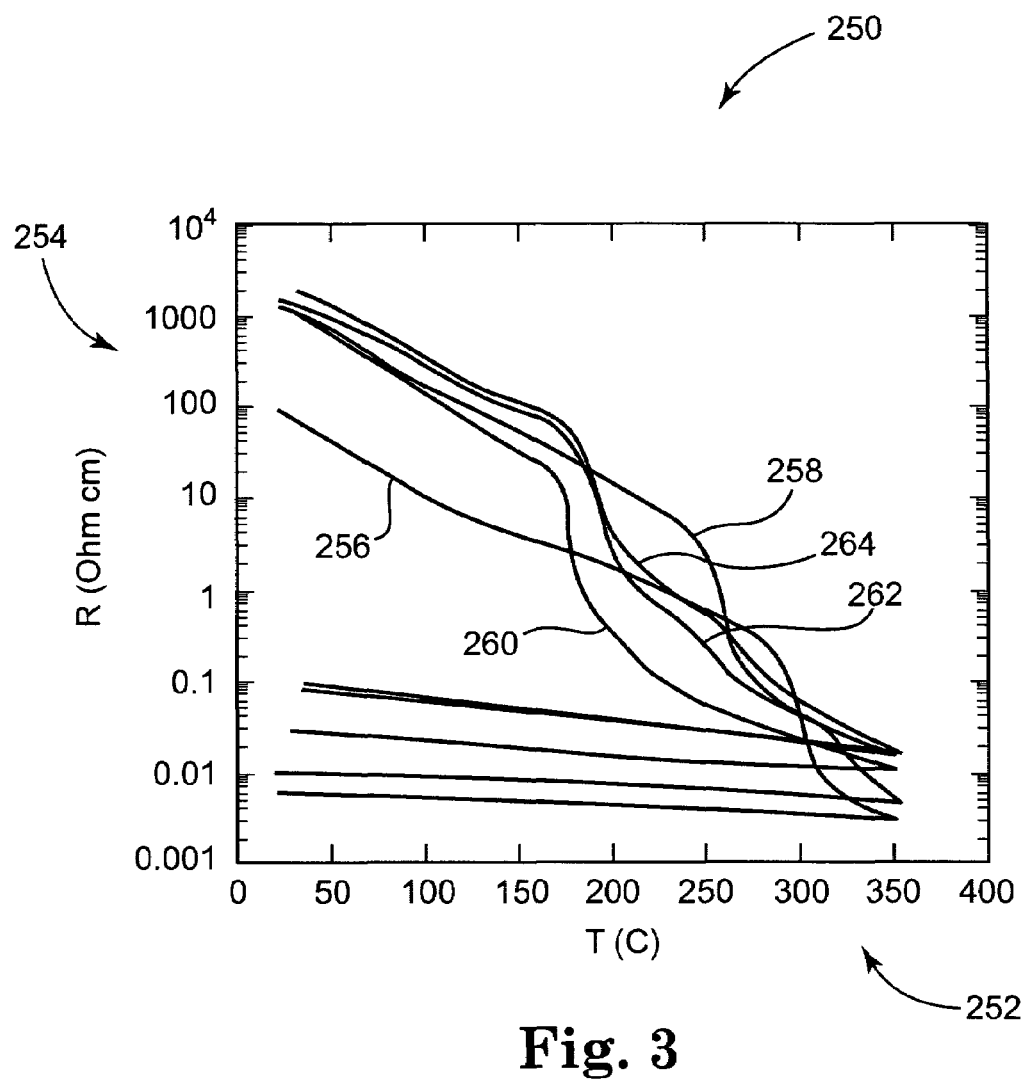
FIG. 3 is a graph illustrating one embodiment of resistivity versus temperature for various phase change materials.

FIG. 3 is a graph 250 illustrating one embodiment of resistivity versus temperature for various phase change materials. Graph 250 includes temperature in degrees Celsius on x-axis 252 and resistivity on a log scale on y-axis 254. GeSb with 20 sccm nitrogen doping is indicated at 256. AgInSbTe with 20 sccm nitrogen doping is indicated at 258. GeSbTe doped with 6.0% silicon is indicated at 260. GeSbTe doped with 11.5% silicon is indicated at 262. GeSbTe doped with 14.3% silicon is indicated at 264. In other embodiments, other phase change materials and doping materials can be used to provide phase change materials having characteristics similar to characteristics illustrated in FIG. 4.

As temperature is increased, the GeSbTe doped with 6.0% silicon has a crystallization temperature such that crystallization substantially increases in a temperature range from approximately 175° C. to 260° C. The GeSbTe doped with 11.5% silicon and the GeSbTe doped with 14.3% silicon have crystallization temperatures such that crystallization substantially increases in a temperature range from approximately 185° C. to 260° C. The AgInSbTe with 20 sccm nitrogen doping has a crystallization temperature such that crystallization substantially increases in a temperature range from approximately 250° C. to 275° C. The GeSb with 20 sccm nitrogen doping has a crystallization temperature such that crystallization substantially increases in a temperature range from approximately 300° C. to 325° C.

Temperature processing during packaging includes increased temperatures for adhesive and mold curing. Also, temperature processing during soldering includes increased temperatures during solder ball reflow and chip soldering. The temperatures achieved during back end processing may be high enough to induce crystallization in the phase change material and reduce data retention or result in data loss in the phase change memory die 26. In one embodiment, the thermal budget for adhesive and mold curing is greater than one and half hours at 175° C. In one embodiment, the thermal budget for solder ball reflow and chip soldering is less than 20 minutes at 180° C.

Figure 4:
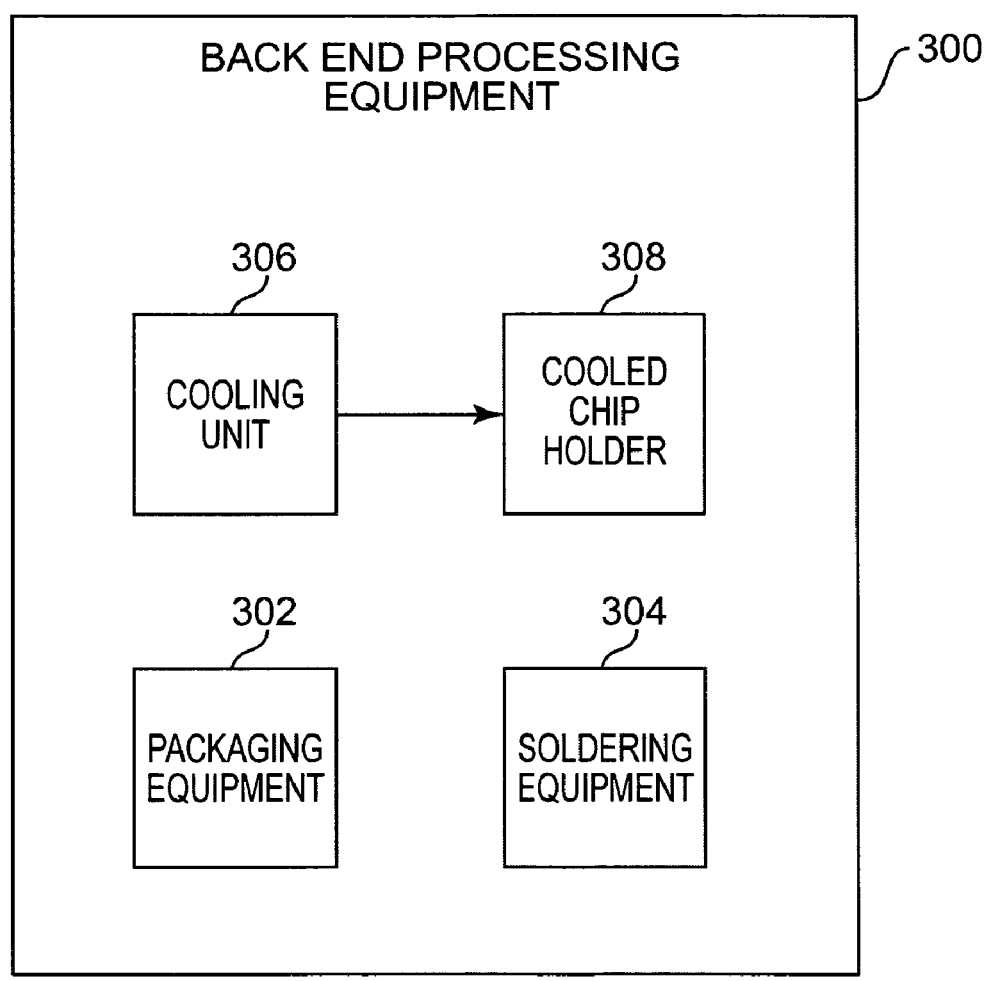
FIG. 4 is a diagram illustrating one embodiment of back end processing equipment, which cools phase change memory die prior to temperature processing.

FIG. 4 is a diagram illustrating one embodiment of back end processing equipment 300, which cools phase change memory die 26 prior to temperature processing. Back end processing equipment 300 packages and solders the cooled phase change memory die 26 to produce packaged phase change memory devices 28. Each of the packaged phase change memory devices 28 has enhanced data retention and/or full data retention of the configuration data. Back end processing equipment 300 is similar to back end processing equipment 24 (shown in FIG. 1).

Back end processing equipment 300 includes packaging equipment 302, soldering equipment 304, a cooling unit 306, and a cooled chip holder 308. Cooling unit 306 cools phase change memory die 26 to a low temperature, such as less than 0° C. or down to minus 20° C., or lower. Cooled chip holder 308 carries and holds the cooled phase change memory die 26 for packaging and soldering the cooled phase change memory die 26.

Packaging equipment 302 packages the cooled phase change memory die 26 and soldering equipment 32 solders the phase change memory die 26 to make electrical contact with package pins. Temperature processing during packaging includes increased temperatures for adhesive and mold curing and temperature processing during soldering includes increased temperatures during solder ball reflow and chip soldering. In one embodiment, the thermal budget for adhesive and mold curing is greater than one and half hours at 175° C. In one embodiment, the thermal budget for solder ball reflow and chip soldering is less than 20 minutes at 180° C.

In operation, configuration data is written into each of the phase change memory die 26 via tester 22 (shown in FIG. 1) prior to back end processing. During back end processing, cooling unit 306 cools the phase change memory die 26 to a low temperature and cooled chip holder 308 carries and holds each of the cooled phase change memory die 26 during soldering and/or packaging. Packaging equipment 302 packages the cooled phase change memory die 26, which includes temperature processing for adhesive and mold curing. Soldering equipment 304 solders the phase change memory die 26 to make electrical contact with package pins, which includes temperature processing for solder ball reflow and chip soldering. The low starting temperature and heat capacity of the phase change memory die 26 keeps the temperature of the phase change memory elements below the crystallization temperature of the phase change memory elements during temperature processing. This effect is enhanced via the cooled chip holder 308.

Back end processing equipment 300 reduces the impact of temperature processing on data retention of the configuration data in phase change memory devices 28. Each of the resulting packaged phase change memory devices 28 has enhanced data retention and/or full data retention of the configuration data.

Figure 5:
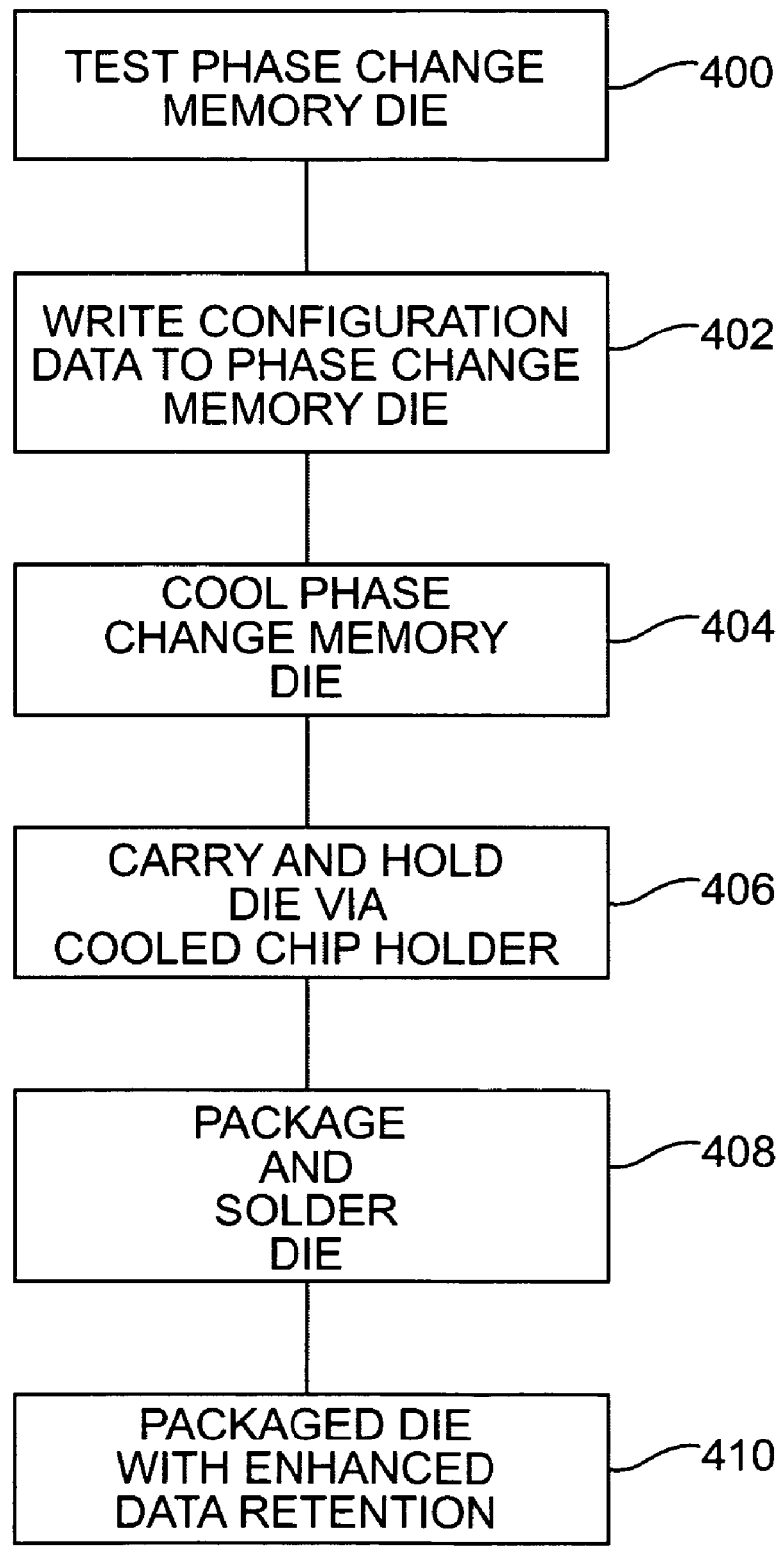
FIG. 5 is a flow chart diagram illustrating one embodiment of a system that cools phase change memory die prior to temperature processing.

FIG. 5 is a flowchart diagram illustrating one embodiment of system 20 that cools phase change memory die 26 prior to temperature processing. At 400, tester 22 tests each of the phase change memory die 26 and obtains corresponding configuration data, such as redundancy activation data and bad block management data, for each of the phase change memory die 26. At 402, tester 22 writes the corresponding configuration data into each of the phase change memory die 26 prior to back end processing.

During back end processing, at 404, cooling unit 306 cools the phase change memory die 26 to a low temperature, such as less than 0° C. or down to minus 20° C., or lower. At 406, cooled chip holder 308 carries and holds the cooled phase change memory die 26 for packaging and soldering the cooled phase change memory die 26. At 408, packaging equipment 302 packages the cooled phase change memory die 26, which includes temperature processing for adhesive and mold curing, and soldering equipment 304 solders the phase change memory die 26 to make electrical contact with package pins, which includes temperature processing for solder ball reflow and chip soldering.

The low starting temperature and heat capacity of the phase change memory die 26 keeps the temperature of the phase change memory elements below the crystallization temperature of the phase change memory elements during temperature processing. This effect is enhanced via the cooled chip holder 308. At 410, each of the packaged phase change memory devices 28 has enhanced data retention and/or full data retention of the configuration data.

Figure 6:
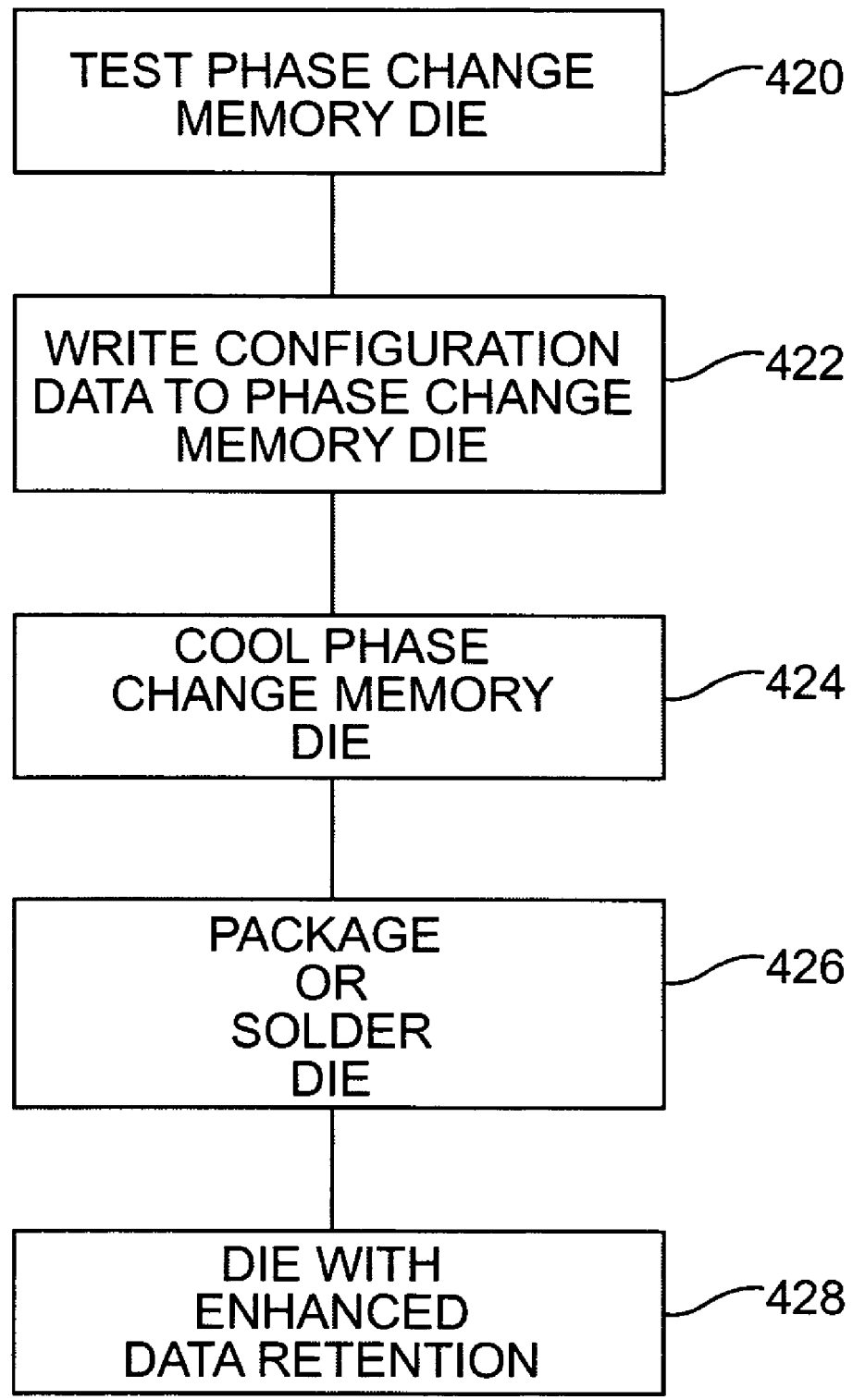
FIG. 6 is a flow chart diagram illustrating one embodiment of a system that cools phase change memory die prior to one of packaging or soldering the die.

FIG. 6 is a flowchart diagram illustrating one embodiment of system 20 that cools phase change memory die 26 prior to temperature processing. At 420, tester 22 tests each of the phase change memory die 26 and obtains corresponding configuration data, such as redundancy activation data and bad block management data, for each of the phase change memory die 26. At 422, tester 22 writes the corresponding configuration data into each of the phase change memory die 26 prior to back end processing.

During back end processing, at 424, cooling unit 306 cools the phase change memory die 26 to a low temperature, such as less than 0° C. or down to minus 20° C., or lower. At 426, the cooled phase change memory die 26 is either packaged or soldered. The low starting temperature and heat capacity of the phase change memory die 26 keeps the temperature of the phase change memory elements below the crystallization temperature of the phase change memory elements during temperature processing. At 428, each of the packaged phase change memory devices 28 has enhanced data retention and/or full data retention of the configuration data.

Figure 7:
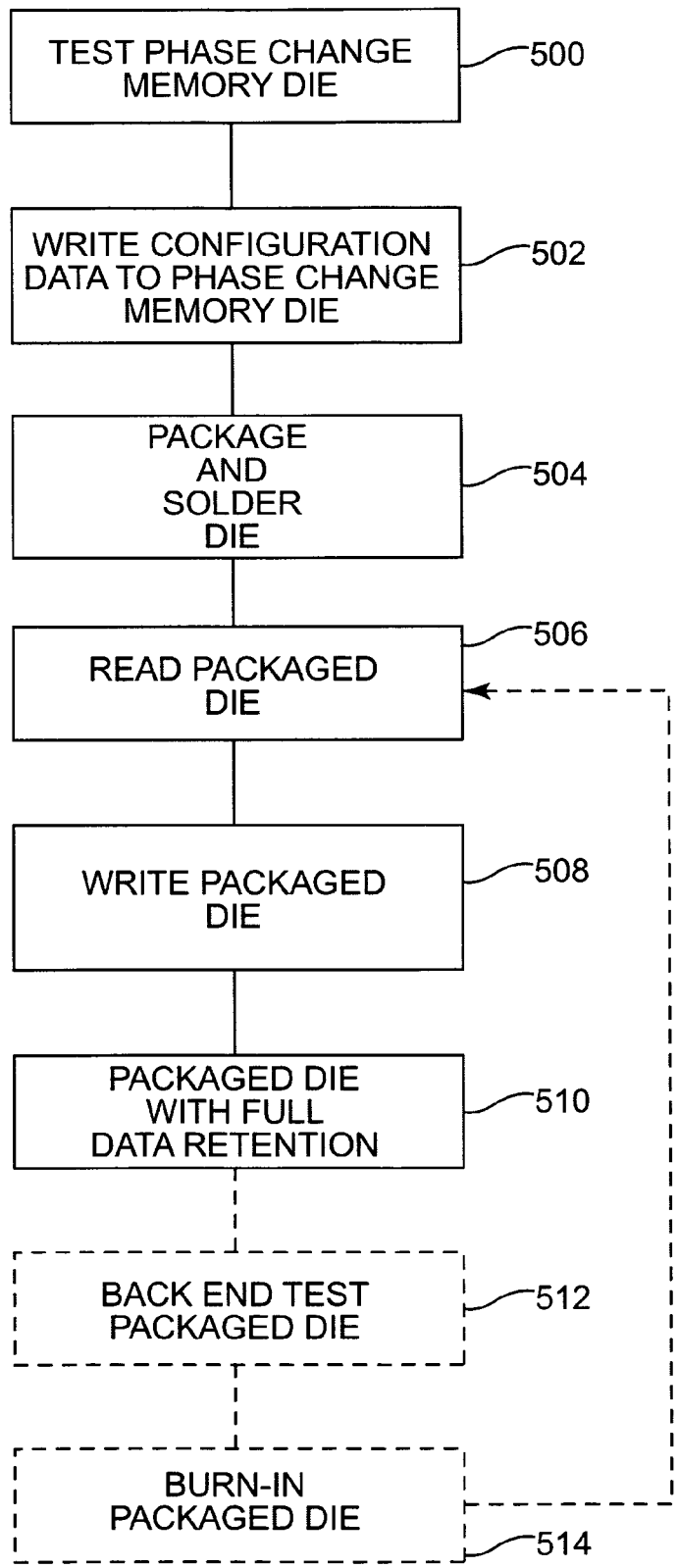
FIG. 7 is a flow chart diagram illustrating one embodiment of a system that reads configuration data after temperature processing and writes the configuration data back into the phase change memory die after temperature processing.

FIG. 7 is a flowchart diagram illustrating one embodiment of system 20 that reads configuration data after temperature processing and re-writes the configuration data back into the phase change memory die 26 after temperature processing. At 500, tester 22 tests each of the phase change memory die 26 and obtains corresponding configuration data, such as redundancy activation data and bad block management data, for each of the phase change memory die 26. At 502, tester 22 writes the corresponding configuration data into each of the phase change memory die 26 prior to back end processing.

At 504, packaging equipment 30 packages the phase change memory die 26, which includes temperature processing for adhesive and mold curing, and soldering equipment 32 solders the phase change memory die 26 to make electrical contact with package pins, which includes temperature processing for solder ball reflow and chip soldering. In one embodiment, the phase change memory die 26 are exposed to temperatures that are close to the crystallization temperature of the phase change memory elements, which can reduce data retention.

At 506, back end processing equipment 24 reads the configuration data from the phase change memory die 26 after temperature processing. At 508, back end processing equipment 24 writes the configuration data back into the corresponding phase change memory die 26. At 510, each of the packaged phase change memory devices 28 has full data retention of the configuration data.

In optional processing at 512, back end processing equipment 24 performs back end tests on the packaged phase change memory devices 28 to obtain additional configuration data about each of the packaged phase change memory devices 28. If additional bit fails are detected in a packaged phase change memory device 28 further chip redundancy is activated in the packaged phase change memory device 28.

Also, a similar strategy can be used after a burn-in procedure, which includes operating the packaged phase change memory devices 28 at elevated temperatures and voltages. In optional processing at 514, the packaged phase change memory devices 28 are burned-in. At 506, back end processing equipment 24 reads the configuration data from the phase change memory die 26 after the burn-in procedure. At 508, back end processing equipment 24 writes the configuration data back into the corresponding phase change memory die 26 after the burn-in procedure. At 510, each of the burned-in packaged phase change memory devices 28 has full data retention of the configuration data.

Figure 8:
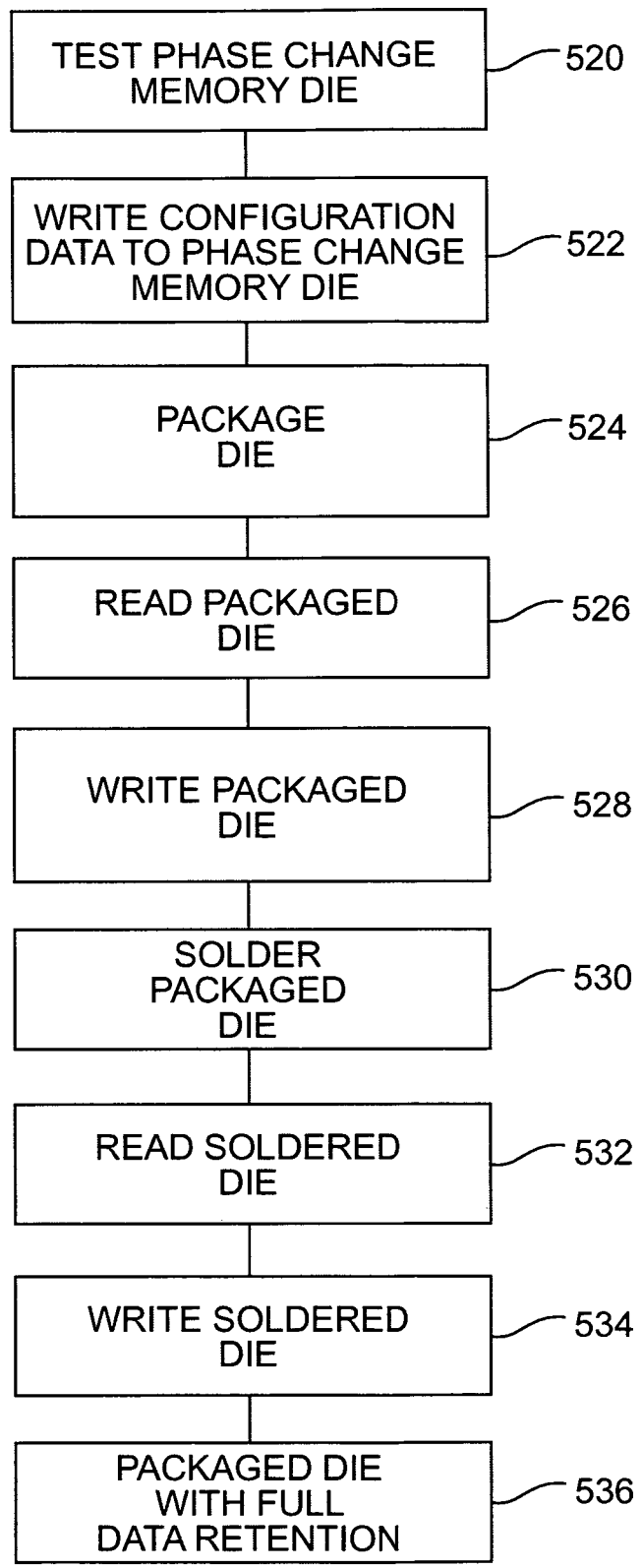
FIG. 8 is a flow chart diagram illustrating one embodiment of a system that reads configuration data from the phase change memory die after packaging and writes the configuration data back into the die prior to soldering and then reads configuration data from the die after soldering and writes the configuration data back into the die.

FIG. 8 is a flowchart diagram illustrating one embodiment of system 20 that reads configuration data after each of packaging and soldering and re-writes the configuration data back into the phase change memory die 26 after each of packaging and soldering. At 520, tester 22 tests each of the phase change memory die 26 and obtains corresponding configuration data, such as redundancy activation data and bad block management data, for each of the phase change memory die 26. At 522, tester 22 writes the corresponding configuration data into each of the phase change memory die 26 prior to packaging.

At 524, packaging equipment 30 packages the phase change memory die 26, which includes temperature processing for adhesive and mold curing. In one embodiment, the phase change memory die 26 are exposed to temperatures that are close to the crystallization temperature of the phase change memory elements, which can reduce data retention. At 526, back end processing equipment 24 reads the configuration data from the phase change memory die 26 after packaging. At 528, back end processing equipment 24 writes the configuration data back into the corresponding phase change memory die 26.

At 530, soldering equipment 32 solders the phase change memory die 26 to make electrical contact with package pins, which includes temperature processing for solder ball reflow and chip soldering. In one embodiment, the phase change memory die 26 are exposed to temperatures that are close to the crystallization temperature of the phase change memory elements, which can reduce data retention. At 532, back end processing equipment 24 reads the configuration data from the phase change memory die 26 after soldering. At 534, back end processing equipment 24 writes the configuration data back into the corresponding phase change memory die 26. At 536, each of the packaged phase change memory die 26 has full data retention of the configuration data.

Figure 9:
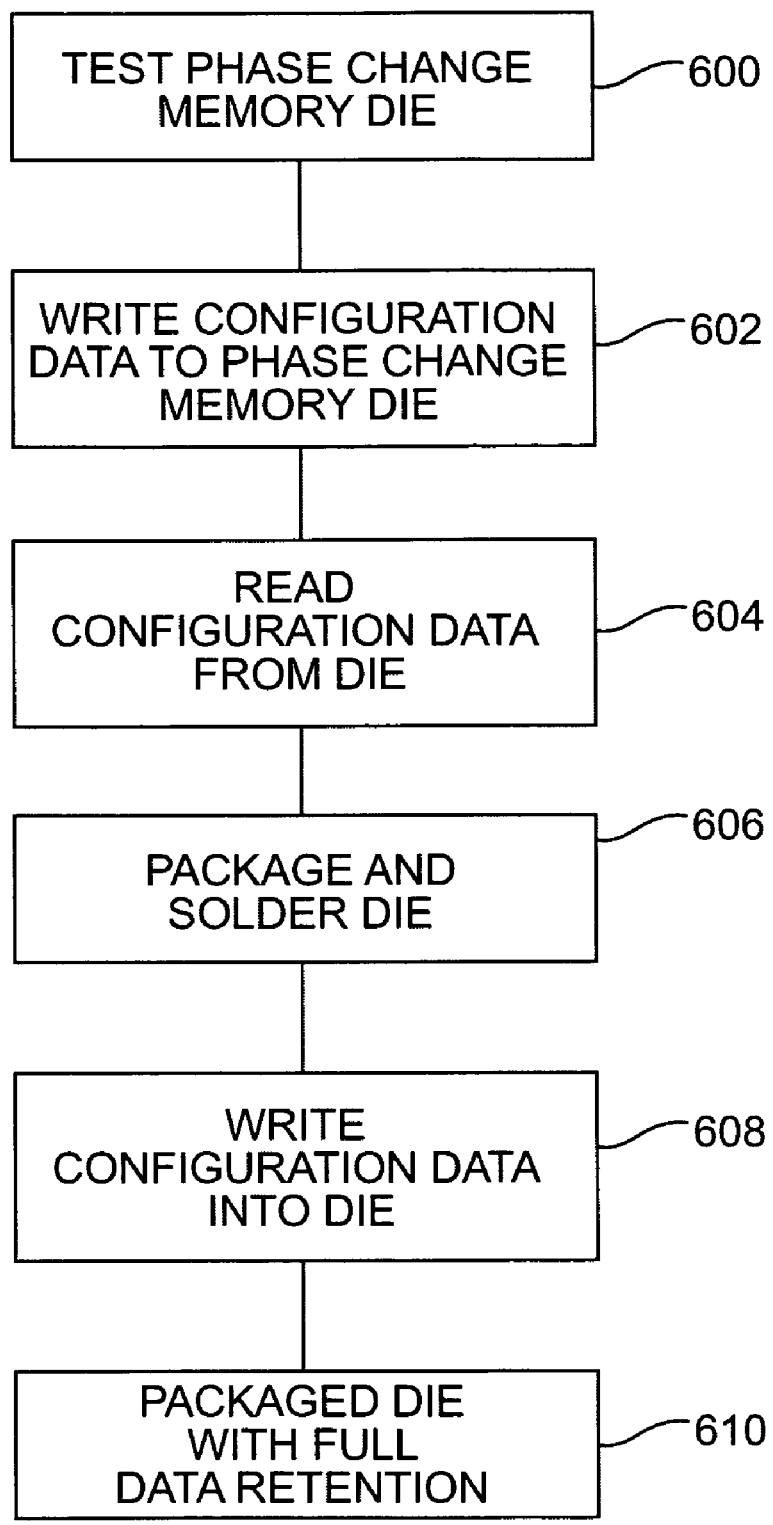
FIG. 9 is a flow chart diagram illustrating one embodiment of a system that reads configuration data prior to temperature processing and writes the configuration data back into the phase change memory die after temperature processing.

FIG. 9 is a flowchart diagram illustrating one embodiment of system 20 that reads configuration data prior to temperature processing and re-writes the configuration data after temperature processing. At 600, tester 22 tests each of the phase change memory die 26 and obtains corresponding configuration data, such as redundancy activation data and bad block management data, for each of the phase change memory die 26. At 602, tester 22 writes the corresponding configuration data into each of the phase change memory die 26 prior to back end processing.

At 604, back end processing equipment 24 reads the configuration data from the phase change memory die 26 prior to temperature processing. At 606, packaging equipment 30 packages the phase change memory die 26, which includes temperature processing for adhesive and mold curing, and soldering equipment 32 solders the phase change memory die 26 to make electrical contact with package pins, which includes temperature processing for solder ball reflow and chip soldering. In one embodiment, the phase change memory die 26 are exposed to temperatures that are close to the crystallization temperature of the phase change memory elements, which can reduce data retention. In one embodiment, the phase change memory die 26 are exposed to temperatures that exceed the crystallization temperature of the phase change memory elements, which can result in data loss.

At 608, back end processing equipment 24 writes the configuration data back into the corresponding phase change memory die 26. At 610, each of the packaged phase change memory devices 28 has full data retention of the configuration data.

Figure 10:
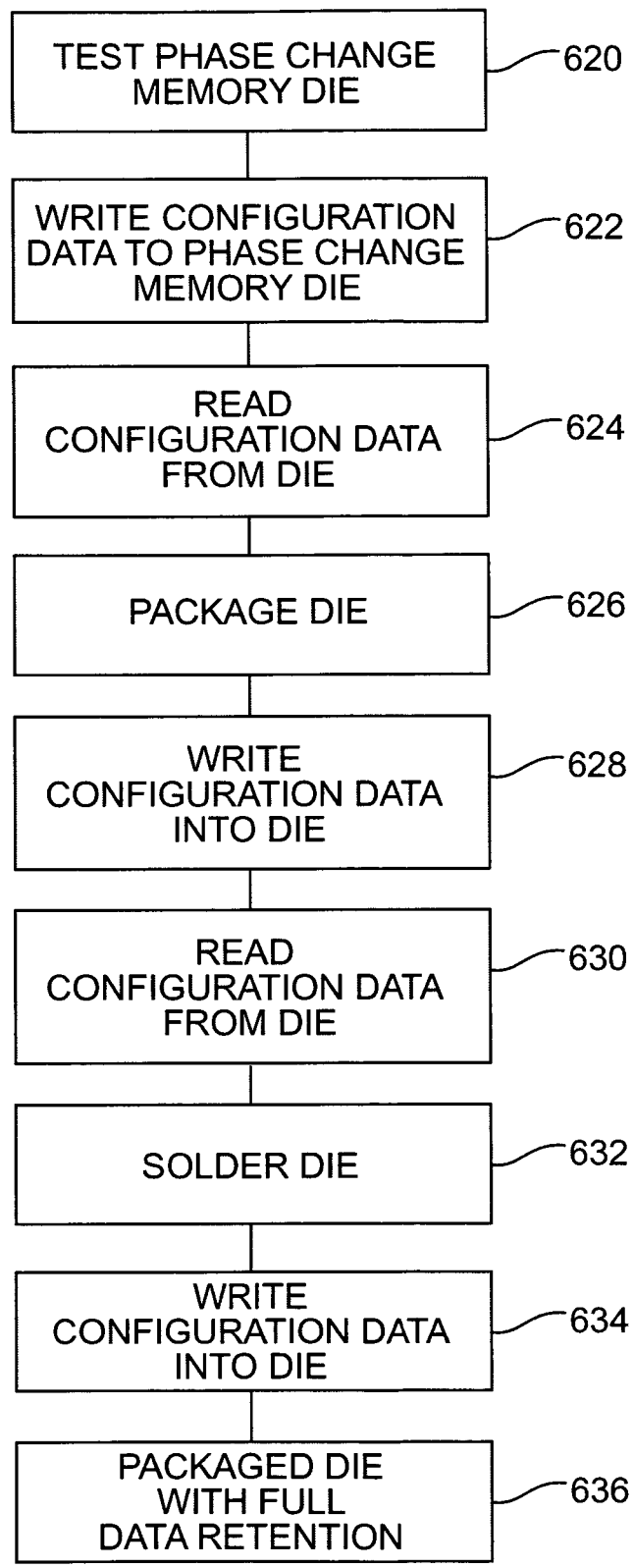
FIG. 10 is a flow chart diagram illustrating one embodiment of a system that reads configuration data from the phase change memory die prior to packaging and writes the configuration data back into the die after packaging and then reads configuration data from the die prior to soldering and writes the configuration data back into the die after soldering.

FIG. 10 is a flowchart diagram illustrating one embodiment of system 20 that reads configuration data prior to each of packaging and soldering and re-writes the configuration data after each of packaging and soldering. At 620, tester 22 tests each of the phase change memory die 26 and obtains corresponding configuration data, such as redundancy activation data and bad block management data, for each of the phase change memory die 26. At 622, tester 22 writes the corresponding configuration data into each of the phase change memory die 26.

At 624, back end processing equipment 24 reads the configuration data from the phase change memory die 26 prior to packaging. At 626, packaging equipment 30 packages the phase change memory die 26, which includes temperature processing for adhesive and mold curing. In one embodiment, the phase change memory die 26 are exposed to temperatures that are close to the crystallization temperature of the phase change memory elements, which can reduce data retention. In one embodiment, the phase change memory die 26 are exposed to temperatures that exceed the crystallization temperature of the phase change memory elements, which can result in data loss.

At 628, back end processing equipment 24 writes the configuration data back into the corresponding phase change memory die 26 after packaging. At 630, back end processing equipment 24 reads the configuration data from the phase change memory die 26 prior to soldering. At 632, soldering equipment 32 solders the phase change memory die 26 to make electrical contact with package pins, which includes temperature processing for solder ball reflow and chip soldering. In one embodiment, the phase change memory die 26 are exposed to temperatures that are close to the crystallization temperature of the phase change memory elements, which can reduce data retention. In one embodiment, the phase change memory die 26 are exposed to temperatures that exceed the crystallization temperature of the phase change memory elements, which can result in data loss.

At 634, back end processing equipment 24 writes the configuration data back into the corresponding phase change memory die 26 after soldering. At 636, each of the packaged phase change memory devices 28 has full data retention of the configuration data.

Figure 11:
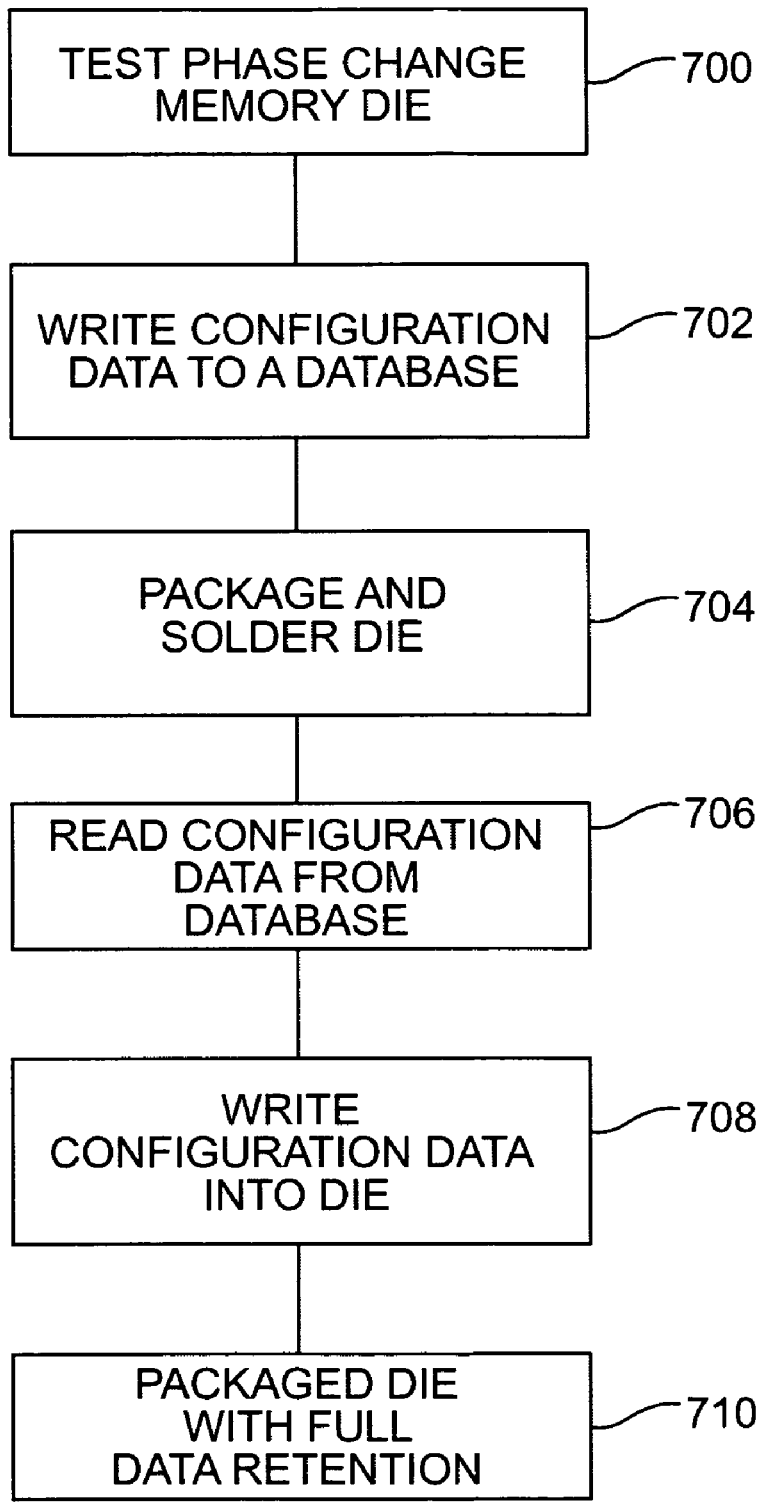
FIG. 11 is a flow chart diagram illustrating one embodiment of a system that writes configuration data to a database.

FIG. 11 is a flowchart diagram illustrating one embodiment of system 20 that writes configuration data to a database. The configuration data is read from the database and written into the phase change memory die 26 after temperature processing.

At 700, tester 22 tests each of the phase change memory die 26 and obtains corresponding configuration data, such as redundancy activation data and bad block management data, for each of the phase change memory die 26. At 702, tester 22 writes the corresponding configuration data to a database.

At 704, packaging equipment 30 packages the phase change memory die 26, which includes temperature processing for adhesive and mold curing, and soldering equipment 32 solders the phase change memory die 26 to make electrical contact with package pins, which includes temperature processing for solder ball reflow and chip soldering. In one embodiment, the phase change memory die 26 are exposed to temperatures that are close to the crystallization temperature of the phase change memory elements, which can reduce data retention. In one embodiment, the phase change memory die 26 are exposed to temperatures that exceed the crystallization temperature of the phase change memory elements, which can result in data loss.

At 706, back end processing equipment 24 reads the configuration data from the database. At 708, back end processing equipment 24 writes the configuration data back into the corresponding phase change memory die 26. At 710, each of the packaged phase change memory devices 28 has full data retention of the configuration data.

Figure 12:
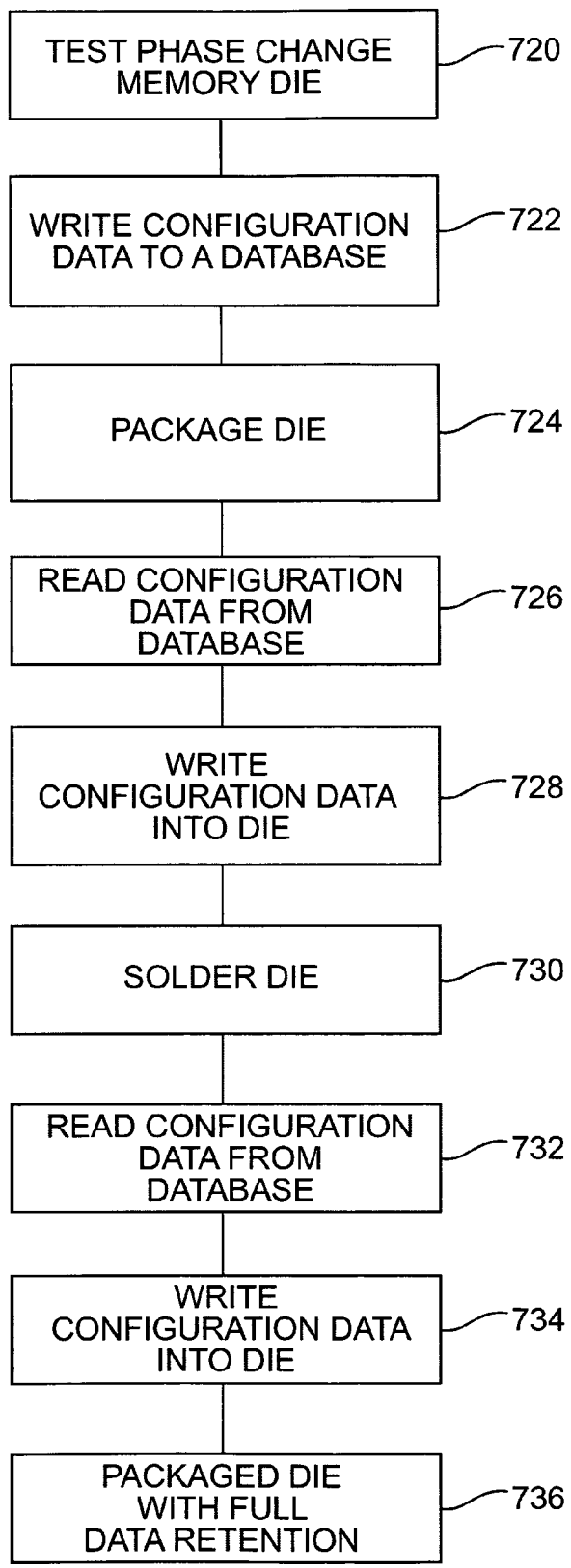
FIG. 12 is a flow chart diagram illustrating one embodiment of a system that writes configuration data to a database and writes the configuration data from the database into the phase change memory die after packaging and then writes the configuration data from the database into the die after soldering.

FIG. 12 is a flowchart diagram illustrating one embodiment of system 20 that writes configuration data to a database. The configuration data is read from the database and written into the phase change memory die 26 after each of packaging and soldering.

At 720, tester 22 tests each of the phase change memory die 26 and obtains corresponding configuration data, such as redundancy activation data and bad block management data, for each of the phase change memory die 26. At 722, tester 22 writes the corresponding configuration data to a database.

At 724, packaging equipment 30 packages the phase change memory die 26, which includes temperature processing for adhesive and mold curing. In one embodiment, the phase change memory die 26 are exposed to temperatures that are close to the crystallization temperature of the phase change memory elements, which can reduce data retention. In one embodiment, the phase change memory die 26 are exposed to temperatures that exceed the crystallization temperature of the phase change memory elements, which can result in data loss.

At 726, back end processing equipment 24 reads the configuration data from the database after packaging. At 728, back end processing equipment 24 writes the configuration data back into the corresponding phase change memory die 26.

At 730, soldering equipment 32 solders the phase change memory die 26 to make electrical contact with package pins, which includes temperature processing for solder ball reflow and chip soldering. In one embodiment, the phase change memory die 26 are exposed to temperatures that are close to the crystallization temperature of the phase change memory elements, which can reduce data retention. In one embodiment, the phase change memory die 26 are exposed to temperatures that exceed the crystallization temperature of the phase change memory elements, which can result in data loss.

At 732, back end processing equipment 24 reads the configuration data from the database after soldering. At 734, back end processing equipment 24 writes the configuration data back into the corresponding phase change memory die 26. At 736, each of the packaged phase change memory devices 28 has full data retention of the configuration data.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system, comprising:
a tester that tests a resistive memory and obtains configuration data for the resistive memory; and
a back end manufacturing system that prevents temperatures in back end processing from reducing data retention time of the configuration data in the resistive memory, wherein the tester writes the configuration data to an external database and the back end manufacturing system retrieves the configuration data from the external database and writes the configuration data retrieved from the external database back into the resistive memory after at least some of the back end processing.

2. The system of claim 1, wherein the resistive memory comprises phase change memory cells, wherein each of the phase change memory cells includes at least one of Ge, Sb, Te, Ga, As, In, Se, and S.

3. A system, comprising:
a tester that tests a phase change memory and obtains configuration data for the phase change memory; and
a back end manufacturing system that prevents temperatures in back end processing from reducing data retention time of the configuration data in the phase change memory.

4. The system of claim 3, wherein the back end manufacturing system comprises:
a cooling system that cools the phase change memory prior to the back end processing.

5. The system of claim 4, wherein the cooling system cools the phase change memory to substantially minus 20 degrees centigrade.

6. The system of claim 4, wherein the back end manufacturing system comprises:
a cooled device that contacts the phase change memory during the back end processing.

7. The system of claim 6, wherein the cooled device comprises a cooled chip holder that holds the phase change memory during the back end processing.

8. The system of claim 3, wherein the back end manufacturing system reads the configuration data from the phase change memory after at least some of the back end processing and writes the configuration data read from the phase change memory back into the phase change memory to enhance data retention.

9. The system of claim 3, wherein the back end manufacturing system tests the phase change memory after packaging the phase change memory and activates chip redundancy in response to bit failures.

10. The system of claim 3, wherein the back end manufacturing system burns in the phase change memory and reads the configuration data from the phase change memory after burning in the phase change memory and writes the configuration data read from the phase change memory back into the phase change memory to enhance data retention.

11. The system of claim 3, wherein the phase change memory includes phase change material having a crystallization temperature approximately equal to soldering temperatures in the back end processing.

12. The system of claim 3, wherein the tester writes the configuration data to an external database and the back end manufacturing system retrieves the configuration data from the external database and writes the configuration data retrieved from the external database back into the phase change memory after at least some of the back end processing.

13. The system of claim 3, wherein the tester writes the configuration data to the phase change memory and the back end manufacturing system reads the configuration data from the phase change memory before the back end processing and writes the configuration data read from the phase change memory back into the phase change memory after at least some of the back end processing.

14. The system of claim 3, wherein the phase change memory includes phase change material having a crystallization temperature that is less than soldering temperatures in the back end processing.

15. The system of claim 3, wherein the phase change memory comprises phase change memory cells, wherein each of the phase change memory cells includes at least one of Ge, Sb, Te, Ga, As, In, Se, and S.

16. A system, comprising:
means for obtaining configuration data of a phase change memory; and
means for preventing temperatures in back end processing from reducing data retention time of the configuration data in the phase change memory.

17. The system of claim 16, wherein the means for preventing comprises:
means for cooling the phase change memory prior to the back end processing.

18. The system of claim 17, wherein the means for preventing comprises:
means for contacting the phase change memory to cool the phase change memory during the back end processing.

19. The system of claim 16, wherein the means for preventing comprises:
means for reading the configuration data from the phase change memory after at least some of the back end processing; and
means for writing the configuration data read from the phase change memory into the phase change memory to enhance data retention.

20. The system of claim 16, wherein the means for obtaining comprises means for writing the configuration data to an external database and wherein the means for preventing comprises:
means for retrieving the configuration data from the external database; and
means for writing the configuration data retrieved from the external database into the phase change memory after at least some of the back end processing.

21. The system of claim 16, wherein the means for obtaining comprises means for writing the configuration data to the phase change memory and wherein the means for preventing comprises:
means for reading the configuration data from the phase change memory before the back end processing; and
means for writing the configuration data read from the phase change memory into the phase change memory after at least some of the back end processing.

22. A method of manufacturing a phase change memory, comprising:
obtaining configuration data of the phase change memory; and
preventing temperatures in back end processing from reducing data retention time of the configuration data in the phase change memory.

23. The method of claim 22, wherein preventing comprises:
cooling the phase change memory prior to the back end processing; and
contacting the phase change memory to cool the phase change memory during the back end processing.

24. The method of claim 23, wherein contacting comprises:
holding the phase change memory to cool the phase change memory during the back end processing.

25. The method of claim 22, wherein preventing comprises:
reading the configuration data from the phase change memory after at least some of the back end processing; and
writing the configuration data read from the phase change memory into the phase change memory to enhance data retention.

26. The method of claim 22, wherein obtaining the configuration data comprises writing the configuration data to an external database and wherein preventing comprises:
retrieving the configuration data from the external database; and
writing the configuration data retrieved from the external database into the phase change memory after at least some of the back end processing.

27. The method of claim 22, wherein obtaining the configuration data comprises writing the configuration data to the phase change memory and wherein preventing comprises:
reading the configuration data from the phase change memory before the back end processing; and
writing the configuration data read from the phase change memory into the phase change memory after at least some of the back end processing.

28. A method for retaining data in a phase change memory during temperature processing in back end processing, comprising:
cooling the phase change memory prior to the temperature processing; and
contacting the phase change memory via a cooled device during the back end processing.

29. The method of claim 28, wherein cooling comprises:
cooling the phase change memory to below 0 degrees centigrade.

30. The method of claim 28, wherein contacting comprises:
holding the phase change memory via a cooled chip holder during the back end processing.

31. A method of enhancing data retention of configuration data stored in a phase change memory, comprising:
soldering the phase change memory during back end processing;
reading the configuration data from the phase change memory after soldering the phase change memory; and
writing the configuration data read from the phase change memory after soldering back into the phase change memory to enhance data retention of the configuration data in the phase change memory.

32. The method of claim 31, comprising:
testing the phase change memory after packaging the phase change memory; and
activating chip redundancy in response to bit failures.

33. The method of claim 31, comprising:
burning in the phase change memory;
reading the configuration data from the phase change memory after burning in the phase change memory;
writing the configuration data read from the phase change memory after burning in the phase change memory back into the phase change memory to achieve full data retention.

34. A method of enhancing data retention of configuration data stored in a phase change memory, comprising:
testing the phase change memory;
obtaining the configuration data during the testing of the phase change memory;
storing the configuration data; and writing the configuration data into the phase change memory after the temperature processing in the back end processing.

35. The method of claim 34, wherein storing the configuration data comprises storing the configuration data in an external database and wherein writing the configuration data comprises:
retrieving the configuration data from the external database; and
writing the configuration data retrieved from the external database into the phase change memory after the temperature processing in the back end processing.

36. The method of claim 34, wherein storing the configuration data comprises storing the configuration data in the phase change memory and wherein writing the configuration data comprises:
reading the configuration data from the phase change memory prior to the temperature processing in the back end processing; and
writing the configuration data retrieved from the phase change memory into the phase change memory after the temperature processing in the back end processing.

* * * * *